(12) United States Patent
Kadota et al.

(10) Patent No.: US 6,297,712 B1
(45) Date of Patent: Oct. 2, 2001

(54) MULTI-MODE EDGE REFLECTION SAW FILTER DEVICE WITH GROUND ELECTRODES BETWEEN STAGES, DUPLEXER, AND COMMUNICATION DEVICE

(75) Inventors: Michio Kadota, Kyoto; Haruo Morii, Kanazawa; Kazuhiko Morozumi, Yokohama; Junya Ago, Nagaokakyo; Hideya Horiuchi, Kyoto, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/317,071

(22) Filed: May 14, 1999

(30) Foreign Application Priority Data

May 21, 1998 (JP) .................................. 10-139934

(51) Int. Cl.[7] .............................. H03H 9/72; H03H 9/64
(52) U.S. Cl. ...................... 333/133; 333/193; 310/313 B
(58) Field of Search ................................. 333/193–196, 333/133; 310/313 R, 313 B, 313 C, 313 D

(56) References Cited

U.S. PATENT DOCUMENTS

| | | | |
|---|---|---|---|
| 4,204,178 | * | 5/1980 | Mitchell ........................ 333/196 X |
| 5,184,042 | * | 2/1993 | Kadota et al. ................. 333/193 X |
| 5,604,393 | | 2/1997 | Suzuki et al. ................. 310/313 D |
| 5,793,147 | * | 8/1998 | Kakota et al. ................ 310/313 R |
| 5,838,217 | * | 11/1998 | Kadota et al. ................ 333/193 |
| 5,952,899 | * | 9/1999 | Kadota et al. ................ 333/133 X |
| 5,977,686 | * | 11/1999 | Kadota et al. ................ 310/313 B |
| 5,986,523 | * | 11/1999 | Morozumi et al. ............ 333/194 |

FOREIGN PATENT DOCUMENTS

| | | |
|---|---|---|
| 0 732 806 | 9/1996 | (EP) . |
| 0 740 411 | 10/1996 | (EP) . |
| 0 762 643 A1 | 3/1997 | (EP) . |
| 0 782 256 A | 7/1997 | (EP) . |
| 0 798 853 A1 | 10/1997 | (EP) . |
| 2 182 514 | 5/1987 | (GB) . |
| 2 312 109 | 10/1997 | (GB) . |
| 2 312 110 | 10/1997 | (GB) . |
| 9-69751 * | 3/1997 | (JP) . |
| 10-261938 * | 9/1998 | (JP) . |

* cited by examiner

Primary Examiner—Benny Lee
Assistant Examiner—Barbara Summons
(74) Attorney, Agent, or Firm—Keating & Bennett, LLP

(57) ABSTRACT

A surface acoustic wave filter apparatus includes a plurality of stages of multi-mode filters defined by edge-reflection type surface acoustic wave devices and electrically connected in series with each other. The plurality of stages of multi-mode filters are provided on a common piezoelectric substrate and arranged in a direction which is substantially perpendicular to the propagation direction of surface acoustic waves. Ground electrodes are located between the stages of the plurality of stages of multi-mode filters.

21 Claims, 9 Drawing Sheets

MULTI-MODE EDGE REFLECTION SAW FILTER DEVICE WITH GROUND ELECTRODES BETWEEN STAGES, DUPLEXER, AND COMMUNICATION DEVICE

BACKGROUND OF THE INVENTION

1. Field of the Invention

The present invention relates to a surface acoustic wave filter apparatus including a plurality of multi-mode filters which are defined by edge-reflection type surface acoustic wave devices, and more particularly, to a surface acoustic wave filter, a duplexer and a communications apparatus which has a very small size and can be connected with a minimum bonding wire because of an improved arrangement and structure of the multiple multi-mode filters.

2. Description of the Related Art

Conventionally, a multi-mode filter including a plurality of edge-reflection type surface acoustic wave resonators has been used as a bandpass filter in a portable communications apparatus such as a cellular phone. A transversally coupled multi-mode filter wherein edge-reflection type surface acoustic wave resonators, which operate using SH type surface acoustic waves such as Love waves and piezoelectric surface shear waves, are electrically connected in series, and a longitudinally coupled multi-mode filter, wherein edge-reflection type surface acoustic wave resonators are acoustically arranged in series, are known types of such a multi-mode filter.

These types of multiple multi-mode filters are often connected in multiple stages to improve the passband width and attenuation characteristics thereof.

FIG. 8 is a plan view of an example of a conventional surface acoustic wave filter, in which three stages of transversely coupled multi-mode filters are electrically connected in series.

The surface acoustic wave filter 101 includes transversely coupled multi-mode filters 102, 103 and 104. As shown in FIG. 8, the three multi-mode filters 102, 103 and 104 are electrically connected in series between input/output ports 105 and 106 by using bonding wires 107.

Each of the multi-mode filters 102, 103 and 104 includes two interdigital electrode transducers (hereinafter referred to as "IDT") disposed on piezoelectric substrates 102x, 103x and 104x, respectively, to define two edge-reflection type resonators. Generally, an IDT has a pair of comb-shaped electrodes which include a plurality of electrode fingers and a bus bar connected to one end of the electrode fingers, respectively. In addition, the pair of comb-shaped electrodes are arranged such that the electrode fingers of comb-shaped electrodes are interdigitated with each other.

Note that, however, in each of the multi-mode filters 102, 103 and 104, one of the comb-shaped electrodes in a first of the IDTs and one of the comb-shaped electrodes in a second of the IDTs are arranged so as to share one bus bar or so as to define one integrated bus bar. As a result, each of the multi-mode filters 102, 103 and 104 actually has three comb-shaped electrodes. That is, two comb-shaped electrodes are arranged such that the bus bars thereof are parallel to each other and such that the electrode fingers thereof respectively extend inward between the bus bars so as to interpose a comb-shaped electrode which includes one bus bar located between the two comb-shaped electrodes and electrode fingers on both sides of the bus bar so as to extend toward the two comb-shaped electrodes, respectively. As a result of this structure, two edge-reflection type resonators of each multi-mode filter are electrically connected in series. When a signal is input to one IDT of each multi-mode filter, a standing wave is generated and an output signal based on the standing wave is output from the other IDT. Since the higher order mode of the standing wave having a different resonance frequency is also generated, each multi-mode filter exhibits filter characteristics.

FIG. 9 is a plan view of an example of a conventional surface acoustic wave filter, in which longitudinally coupled multi-mode filters are electrically connected in series in two stages.

The surface acoustic wave filter apparatus 111 has longitudinally coupled multi-mode filters 112 and 113. As shown in FIG. 9, the two multi-mode filters 112 and 113 are electrically connected in series between input/output ports 115 and 116 via a bonding wire 117.

Each of the multi-mode filters 112 and 113 include two IDTs disposed on piezoelectric substrates 112x and 113x, respectively. Each of the IDTs has a pair of comb-shaped electrodes which include a plurality of electrode fingers and a bus bar connected to one end of the electrode fingers, respectively. In addition, the pair of comb-shaped electrodes are arranged such that the electrode fingers of comb-shaped electrodes are interdigitated with each other.

In each of the multi-mode filters 112 and 113, the two IDTs are arranged in the direction in which the surface acoustic wave propagates. When a signal is input to one IDT of the each multi-mode filter, a standing wave is generated and an output signal based on the standing wave is output from the other IDT. Since the higher order mode of the standing wave having a different resonance frequency is also generated, each multi-mode filter exhibits filter characteristics.

In the conventional surface acoustic wave filters 101 and 111, the multi-mode filters 102~104, 112 and 113 are provided on separate piezoelectric substrates 102x~104x, 112x and 113x. Therefore, each of the multi-mode filters 102~104, 112 and 113 must be connected with each other using bonding wire, which makes the manufacturing process complicated.

Further, the end surfaces of the piezoelectric substrate in the edge-reflection type resonators must be formed with high precision in order to achieve accurate operation of the edge-reflection type resonators. Since these end surfaces are formed by cutting piezoelectric substrates via dicing, the dicing process must be carried out for each piezoelectric substrate with high precision. As a consequence, dicing must be carried out many times and very carefully, making the manufacturing process complex.

In addition, the piezoelectric substrates are located at a fixed distance from each other in order to prevent mutual electromagnetic interference between the multi-mode filters, which makes it difficult to produce a small-size surface acoustic wave filter apparatus.

SUMMARY OF THE INVENTION

To overcome the problems described above, preferred embodiments of the present invention provide a surface acoustic wave filter which is constructed simply and inexpensively to have a very small size and such that mutual electromagnetic interference between the multi-mode filters is greatly reduced and the dicing process is simplified.

According to one preferred embodiment of the present invention, a surface acoustic wave filter includes a plurality of stages of multi-mode filters, defined by edge-reflection type resonators which are electrically connected in series, wherein the plurality of stages of multi-mode filters are provided on a common piezoelectric substrate, and arranged to extend in a direction which is substantially perpendicular to a propagation direction of surface acoustic waves generated in the filter and ground electrodes are provided between respective stages of the plurality of stages of the multi-mode filters.

In the surface acoustic wave filter apparatus, at least one of the multi-mode filters of the plurality of stages of the multi-mode filters may be coupled in a transversal mode or a longitudinal mode.

The above-described construction and arrangement of the elements of the surface acoustic wave apparatus according to preferred embodiments greatly reduce mutual electromagnetic interference between the multi-mode filters, and greatly reduce the complexity and time required for the dicing processes of the substrate end surfaces.

The ground electrodes preferably occupy at least more than about half of the space between stages of the plurality of multi-mode filters. As a result, it is possible to further reduce mutual electromagnetic interference between the multi-mode filters.

The ground electrodes may be connected together via connection electrodes. As a consequence, areas of low resistance can be selected for grounding the ground electrodes.

The distances between stages of the plurality of multi-mode filters are preferably greater than an intersection width (cross-width) of the interdigital transducers which define the multi-mode filters. As a result, the mutual electromagnetic interference between the multi-mode filters can be almost completely eliminated.

One part of the interdigital transducers of the plurality of multi-mode filters may be divided, and, in the divided part, grounded sides of the interdigital transducers of the plurality of multi-mode filters may be connected at a plurality of portions to the ground electrodes. Consequently, an increase in resistance of the connecting electrode can be prevented.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
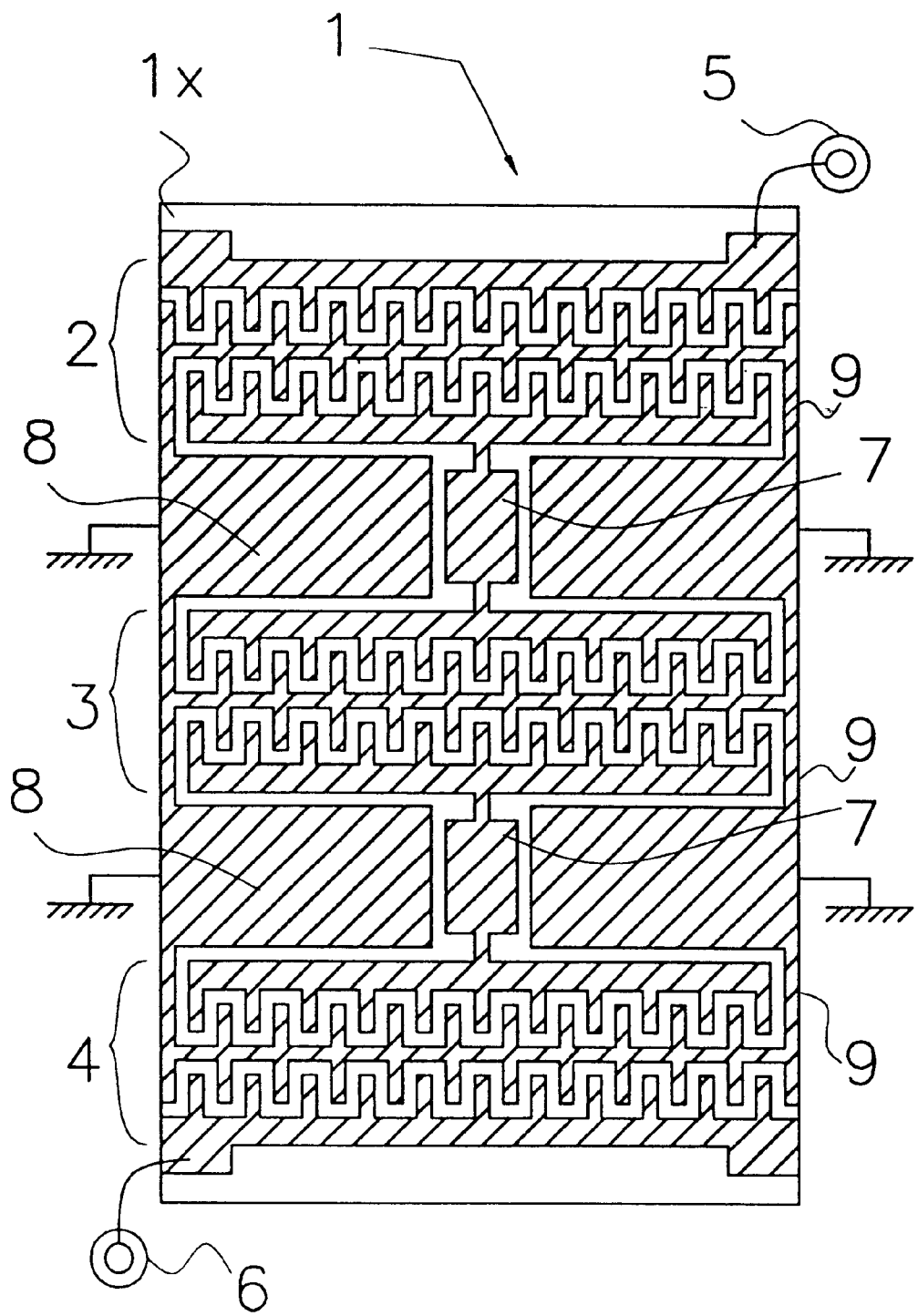
FIG. 1 is a plan view of a surface acoustic wave filter apparatus according to a first preferred embodiment of the present invention.

Hereinafter, preferred embodiments of the present invention are explained in detail with reference to the drawings.

A first preferred embodiment of the present invention will be explained with reference to FIG. 1.

The surface acoustic wave filter apparatus 1 preferably includes a plurality of transversely coupled multi-mode filters 2, 3 and 4. As shown in FIG. 1, the three multi-mode filters 2, 3 and 4 are electrically connected in series between input/output ports 5 and 6 via strip lines 7.

Each of the multi-mode filters 2, 3 and 4 includes two IDTs provided on a single, common piezoelectric substrate $1x$. Each IDT defines an edge-reflection type resonator, and therefore, two edge-reflection type resonators are electrically connected in series to define a corresponding multi-mode filter, so that piezoelectric surface shear waves can be used as the SH-type surface acoustic waves.

Furthermore, ground electrodes 8 are provided between the stages of the multi-mode filters 2, 3 and 4, and are electrically isolated from the strip lines 7. The ground electrodes 8 are connected via connection electrodes 9 to the grounded sides of the IDTs of the multi-mode filters 2, 3 and 4. Therefore, the ground electrodes 8 on the piezoelectric substrate $1x$ and the grounded sides of the IDTs of the multi-mode filters 2, 3 and 4 are all connected in a single structure. This structure is grounded to ground electrodes of a circuit board and ground terminals on the case at positions of the ground electrodes 8 provided between the stages of the multi-mode filters 2, 3 and 4, using bonding wire or face-down bonding.

As described above, in the present preferred embodiment, the multi-mode filters 2, 3 and 4 are arranged on a single, common piezoelectric substrate in a direction which is substantially perpendicular to the propagation direction of the surface acoustic waves, thereby reducing the number of dicing steps required to be performed on the piezoelectric substrate, and greatly simplifying the manufacturing process.

Furthermore, in the present preferred embodiment, since the multi-mode filters 2, 3 and 4 are electrically connected in series via the strip lines 7, there is no need to use bonding wire for the multi-mode filter connection, thereby decreasing the time and difficulty involved in the connecting operation.

Moreover, in the present preferred embodiment, the ground electrodes 8 are located between the stages of the multi-mode filters 2, 3 and 4, thereby enabling electromagnetic mutual interference between the multi-mode filters 2, 3 and 4 to be greatly reduced.

As the ground electrodes 8 make it possible to reduce electromagnetic mutual interference between the multi-mode filters 2, 3 and 4, it is preferable that the ground electrodes 8 cover the piezoelectric substrate $1x$ along an area as large as possible as long as the ground electrodes 8 are isolated from the strip lines 7. However, a small degree of mutual electromagnetic interference generated between multi-mode filters causes no damage, and therefore, as long as the area of the ground electrodes 8 occupies more than about half of the area between the stages, the apparatus can adequately function as a surface acoustic wave filter.

Furthermore, considering that the ground electrodes 8 reduce mutual electromagnetic interference between the multi-mode filters 2, 3 and 4, the greater the width of the ground electrodes 8 in the direction substantially perpendicular to the propagation direction of the surface acoustic waves, the better. As long as the ground electrodes 8 are at least wider than the aperture (cross-width) of the IDTs of the multi-mode filters 2, 3 and 4, it is possible to almost completely eliminate mutual electromagnetic interference between the multi-mode filters 2, 3 and 4.

In the present preferred embodiment, the ground electrodes of the circuit substrate and the ground terminals of the case are grounded at the positions of the ground electrodes 8, thereby enabling the ground electrodes and ground terminals to be grounded with stability and low resistance.

At this point, grounding should preferably be at all four of the ground electrodes 8 shown in FIG. 1. Nevertheless, even when only one of the electrodes 8 is grounded, the surface acoustic wave filter achieves the desired characteristics, although the attenuation characteristics may slightly decrease.

In FIG. 1, the connection electrodes 9 are located near the substrate end surfaces which reflect the surface acoustic waves, and the ground electrodes 8 are connected to the ground sides of the IDT of the multi-mode filters 2, 3 and 4. However, the present invention is not limited to this arrangement, and the connection electrodes 9 may, for instance, be provided at positions which are distant from the end surfaces.

Figure 2:
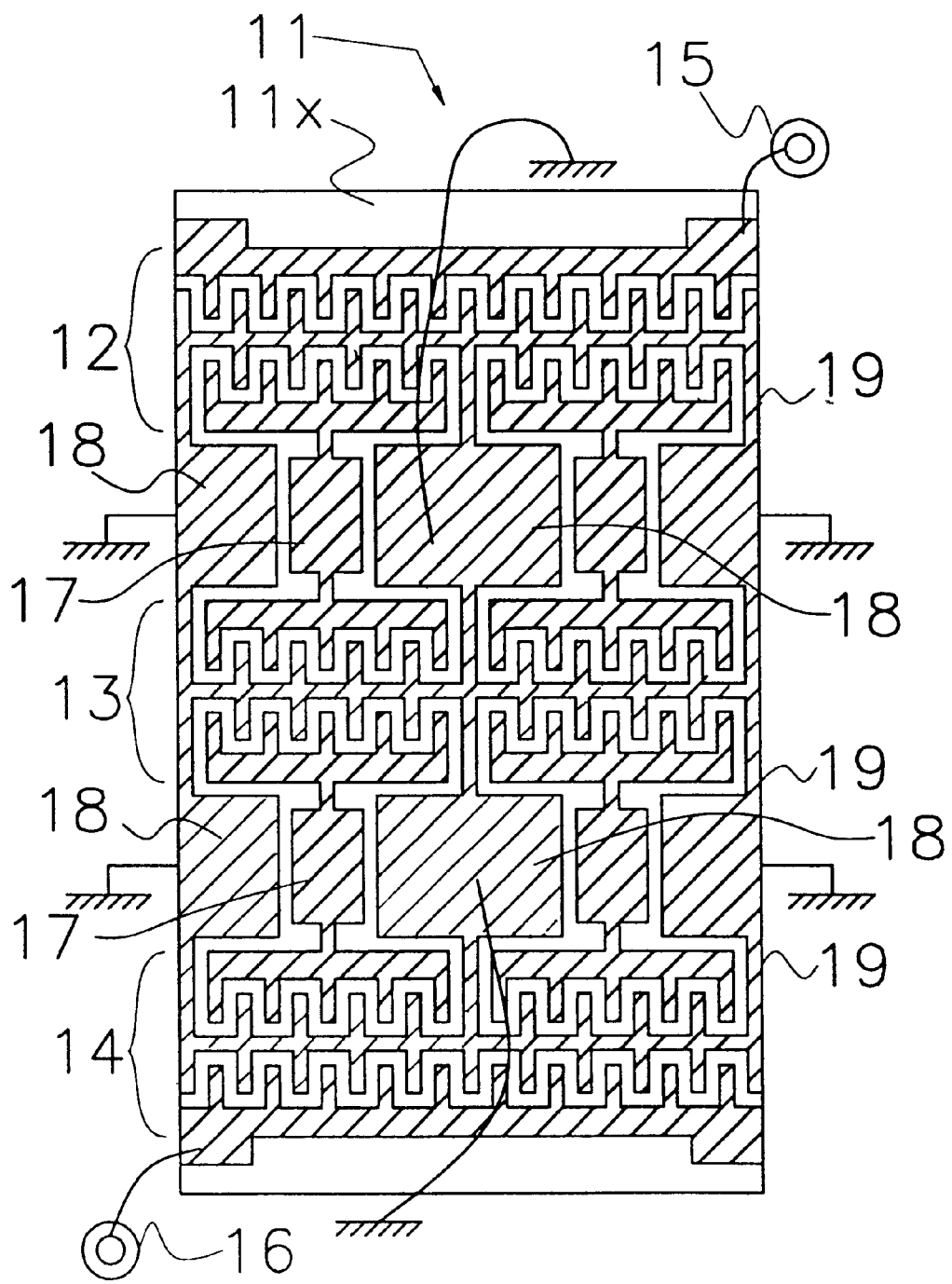
FIG. 2 is a plan view of a surface acoustic wave filter apparatus according to a first modification of the first preferred embodiment of the present invention.

Hereinafter, modifications to the first preferred embodiment of the present invention will be explained referring to FIG. 2 and FIG. 3. FIG. 2 is a plan view of a first modification of the first preferred embodiment of the present invention, and FIG. 3 is a plan view of a second modification of the first preferred embodiment of the present invention.

As shown in FIG. 2, the surface acoustic wave filter apparatus 11 includes transversely coupled multi-mode filters 12, 13 and 14. The three multi-mode filters 12, 13 and 14 are electrically connected in series between input/output ports 15 and 16, using strip lines 17, and are provided on a single common piezoelectric substrate 11x.

Ground electrodes 18 are located between the stages of the multi-mode filters 12, 13 and 14, and are insulated from the strip lines 17. The ground electrodes 18 connect via connection electrodes 19 to the ground sides of the IDTs of the multi-mode filters 12, 13 and 14.

Figure 3:
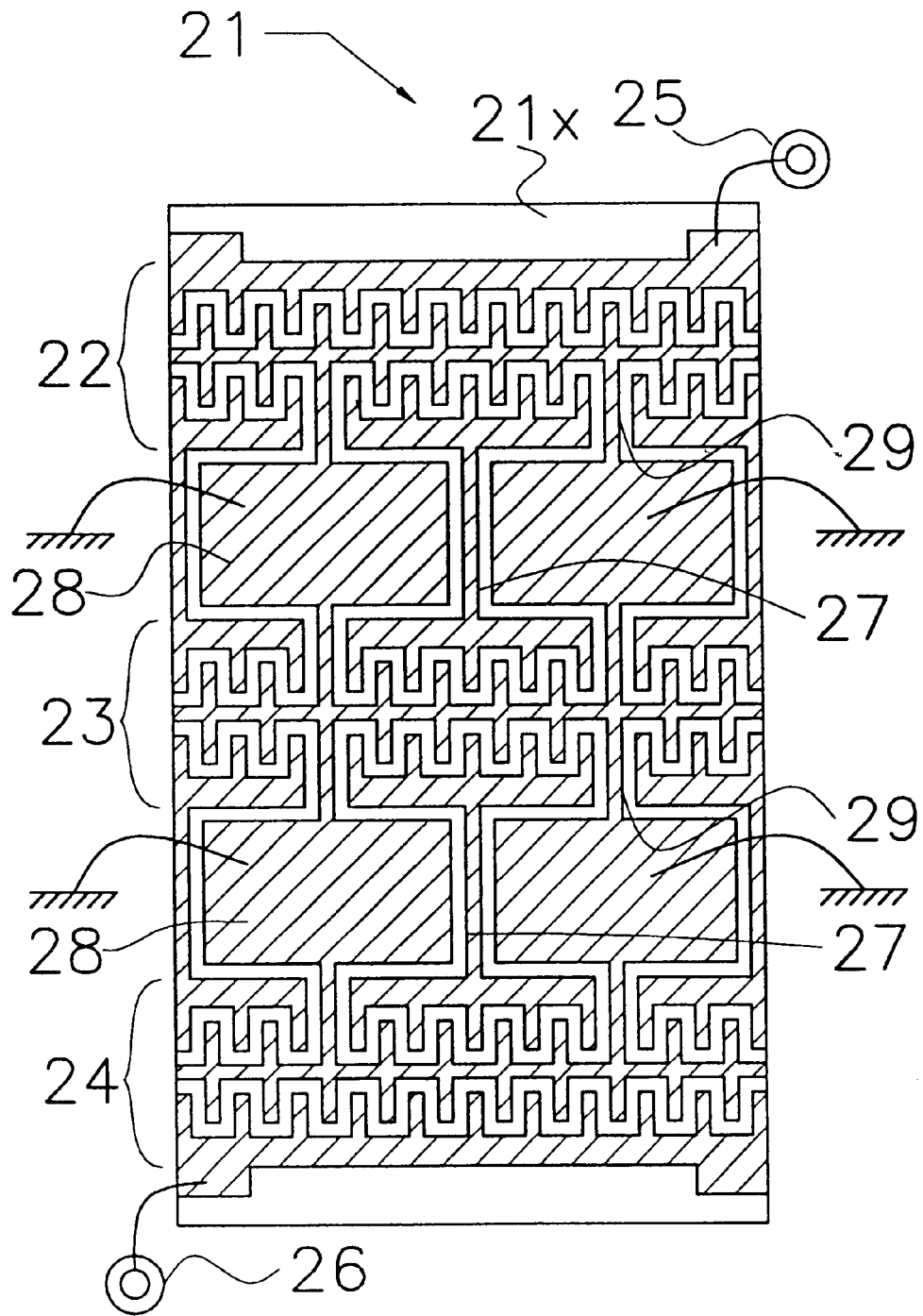
FIG. 3 is a plan view of a surface acoustic wave filter apparatus according to a second modification of the first preferred embodiment of the present invention.

Furthermore, as shown in FIG. 3, the surface acoustic wave filter apparatus 21 has transversely coupled multi-mode filters 22, 23 and 24. The three multi-mode filters 22, 23 and 24 are electrically connected in series between input/output ports 25 and 26, using strip lines 27, and are provided on a single common piezoelectric substrate 21x.

Ground electrodes 28 are located between the stages of the multi-mode filters 22, 23 and 24, and are electrically isolated from the strip lines 27. The ground electrodes 28 are connected via connection electrodes 29 to the ground sides of the IDTs of the multi-mode filters 22, 23 and 24.

The structures shown in FIGS. 2 and 3 achieve the same results as the surface acoustic wave filter apparatus 1 of FIG. 1.

Furthermore, when the resistance components of the thin connection electrodes become a problem in the multi-mode filters of FIG. 1, the number of connection electrodes can be reduced by dividing parts of the IDT and connecting the ground sides of the IDT of the multi-mode filters to the ground electrodes 28 in the divided parts, as shown in FIGS. 2 and 3, thereby reducing the resistant components which are causing problems.

Further, the electrode width of the connection electrodes in the multi-mode filters of FIG. 1 varies depending on the precision of the dicing of the piezoelectric substrate. When this variation in the electrode width of the connection electrodes becomes a problem, it can be eliminated by dividing parts of the IDT and connecting the ground sides of the IDT of the multi-mode filters to the ground electrodes 28 only in the divided parts, as shown in FIG. 3.

Figure 4:
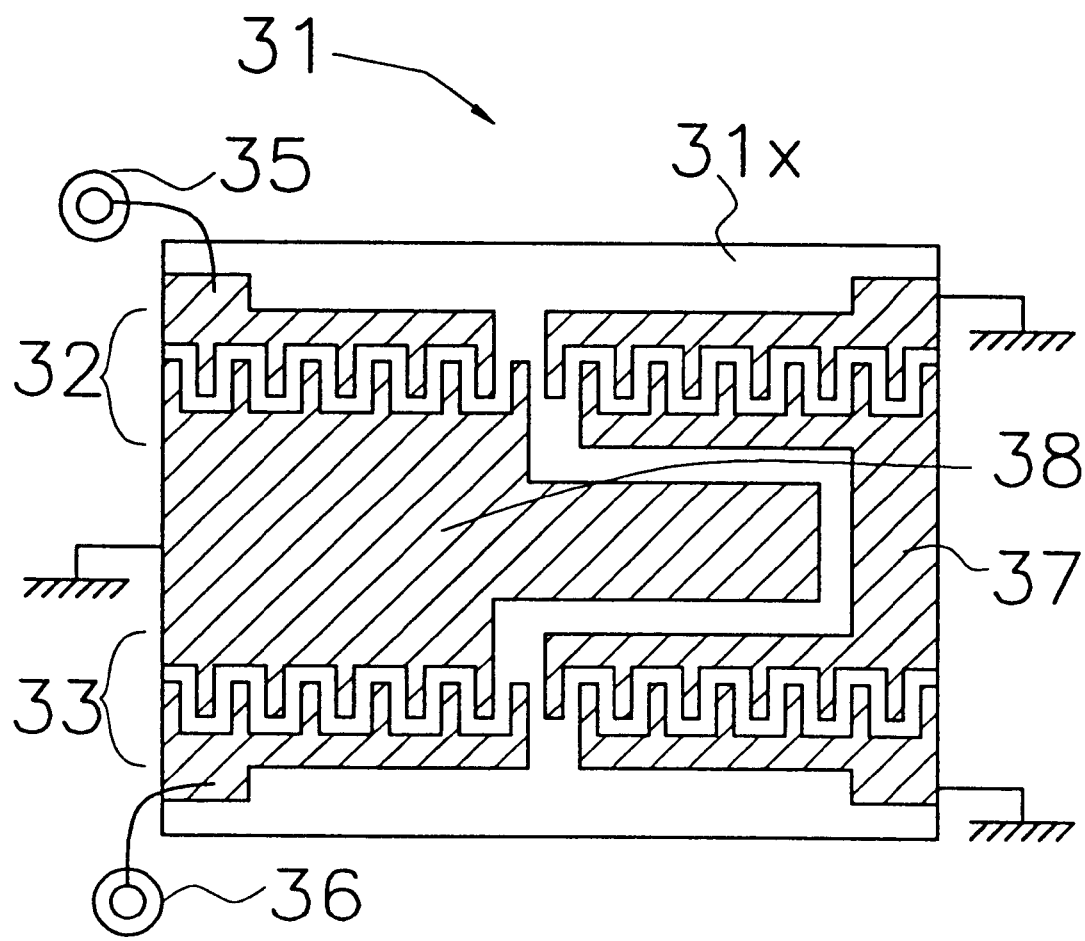
FIG. 4 is a plan view of a surface acoustic wave filter apparatus according to a third modification of the first preferred embodiment of the present invention.

Next, a third modification of the first preferred embodiment of the present invention will be explained. FIG. 4 is a plan view of a surface acoustic wave filter apparatus, illustrating a third modification of the first preferred embodiment of the present invention.

The surface acoustic wave filter apparatus 31 includes longitudinally (vertically) coupled multi-mode filters 32 and 33. As shown in FIG. 4, the two multi-mode filters 32 and 33 are electrically connected in series between input/output ports 35 and 36 via strip lines 37.

Each of the multi-mode filters 32 and 33 includes two IDTs provided on a single common piezoelectric substrate 31x. Each IDT constitutes an edge-reflection type resonator, electrically connected in series, thereby enabling piezoelectric surface shear waves to be used as the SH-type surface acoustic waves.

Ground electrodes 38 are located between the stages of the multi-mode filters 32 and 33, and are electrically isolated from the strip lines 37. The ground electrodes 38 are connected to the ground sides of the IDTs of the multi-mode filters 32 and 33.

With the above-described unique arrangement and construction, a surface acoustic wave filter apparatus having vertically coupled multi-mode filters achieves the same results as the surface acoustic wave filter apparatuses of the first preferred embodiment, having transversely coupled multi-mode filters, explained in FIGS. 1 to 3.

Figure 5:
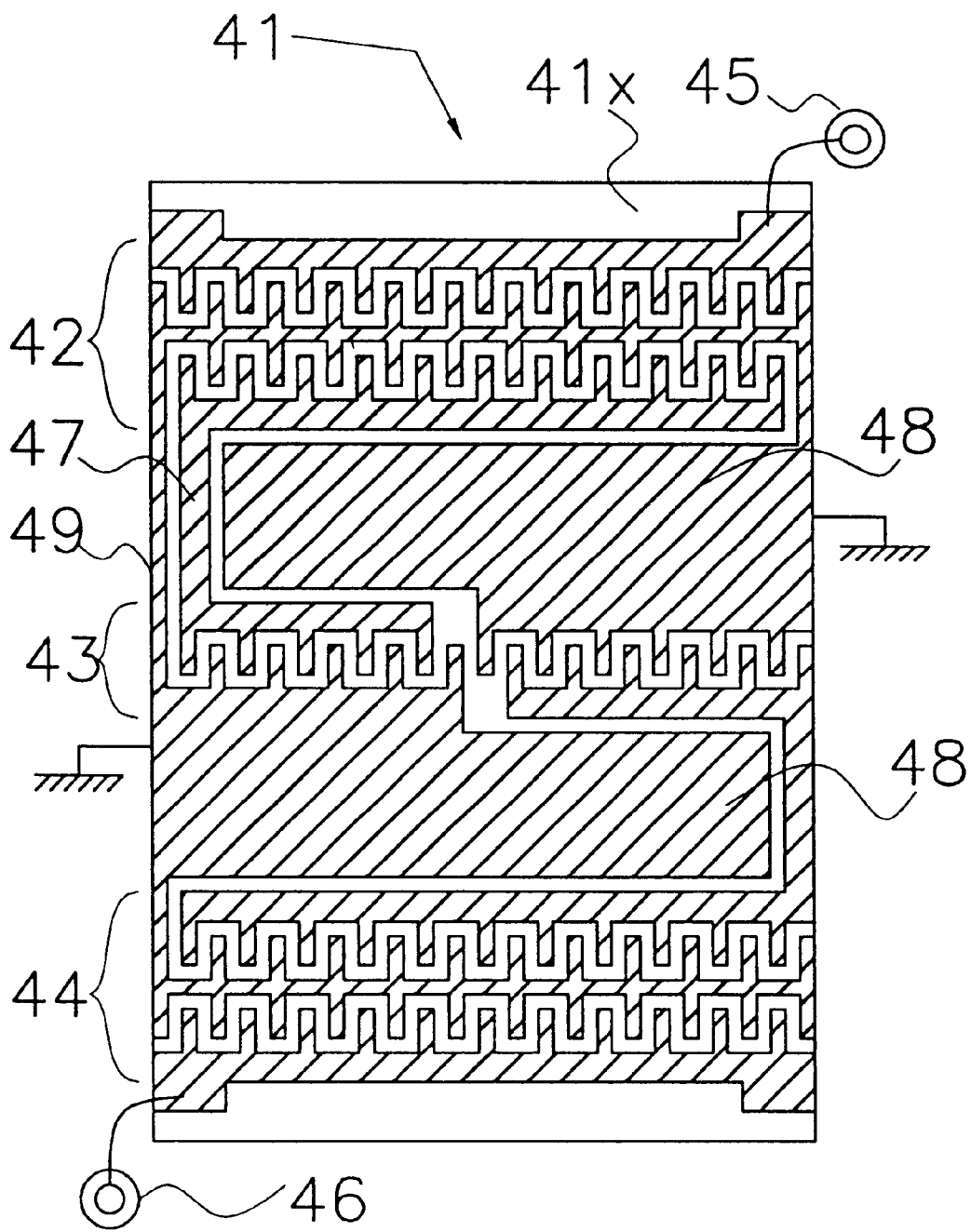
FIG. 5 is a plan view of a surface acoustic wave filter apparatus according to a fifth modification of the first preferred embodiment of the present invention.

Next, a fourth modification of the first preferred embodiment of the present invention will be explained. FIG. 5 is a plan view of a surface acoustic wave filter apparatus, illustrating a fourth modification of the first preferred embodiment of the present invention.

The surface acoustic wave filter apparatus 41 includes transversely coupled multi-mode filters 42 and 44, and a vertically coupled multi-mode filter 43. As shown in FIG. 5, the transversely coupled multi-mode filter 42, the vertically coupled multi-mode filter 43, and the transversely coupled multi-mode filter 44 are electrically connected in series between input/output ports 45 and 46 using strip lines 47, and are provided on a single common piezoelectric substrate 41x.

Ground electrodes 48 are located between the stages of the multi-mode filters 42, 43 and 44, and are insulated from the strip lines 47. The ground electrodes 48 are connected via connection electrodes 49 to the ground sides of the IDTs of the multi-mode filters 42, 43 and 44.

With the above-described unique arrangement and construction, a surface acoustic wave filter apparatus which includes a combination of a vertically coupled multi-mode filter and transversely coupled multi-mode filters, achieves the same results as the surface acoustic wave filter apparatus of the first preferred embodiment explained in FIG. 1 to FIG. 4.

Figure 6:
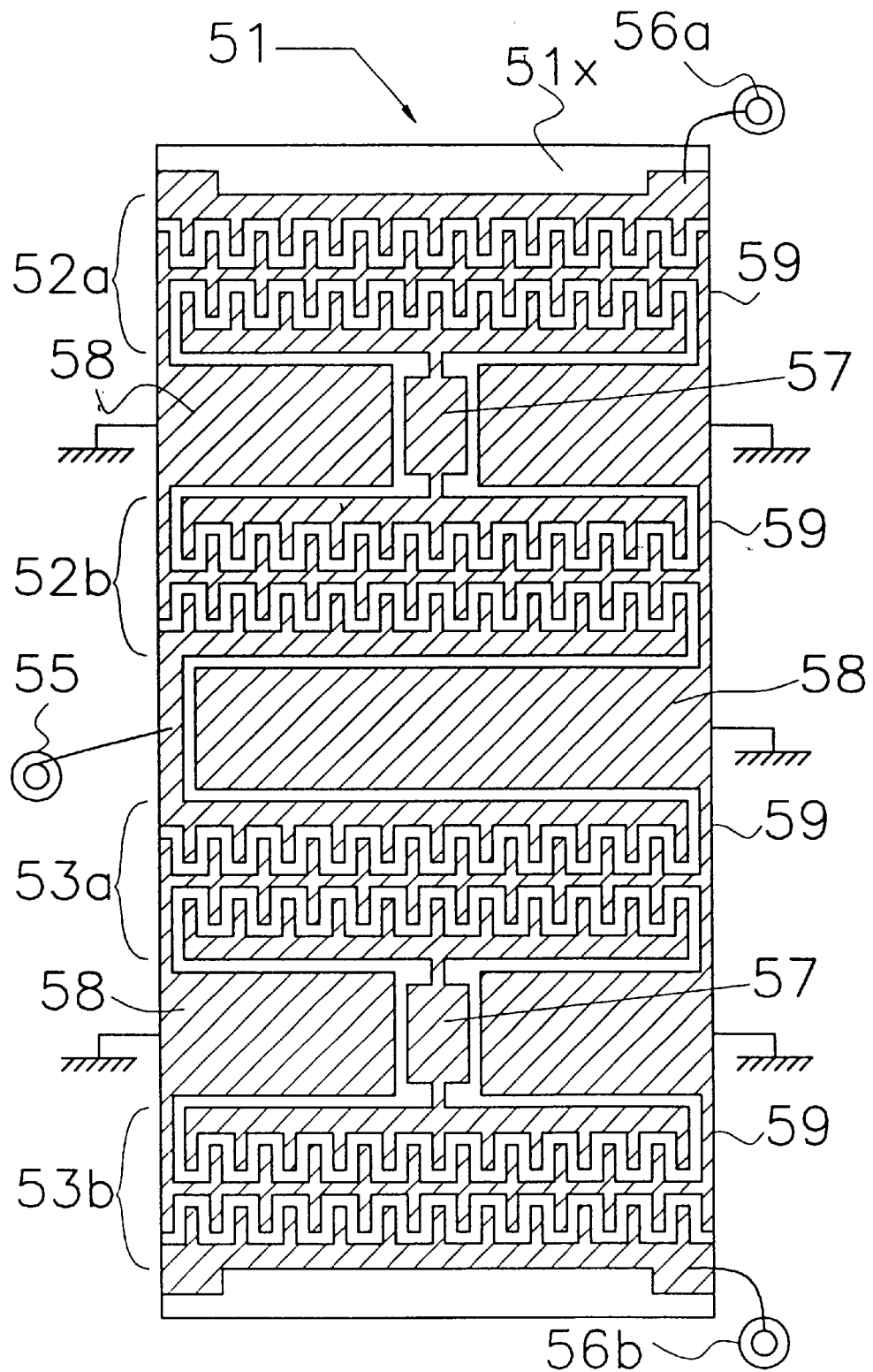
FIG. 6 is a plan view of a duplexer according to a second preferred embodiment of the present invention.

Next, a second preferred embodiment of the present invention will be explained. FIG. 6 is a plan view of a second preferred embodiment of the present invention.

A duplexer 51 has transversely coupled multi-mode filters 52a, 52b, 53a and 53b. As shown in FIG. 6, the two multi-mode filters 52b and 52a are electrically connected in series between input/output ports 55 and 56a via a strip line 57. Further, the two multi-mode filters 53a and 53b are electrically connected in series between input/output ports 55 and 56b via a strip line 57. Each of the multi-mode filters 52a, 52b, 53a and 53b includes two IDTs provided on one piezoelectric substrate 51x.

Ground electrodes 58 are insulated from the strip lines 57, and are located between the multi-mode filters 52a and 52b, and between the multi-mode filters 53a and 53b. A ground electrode 58 is also provided between the multi-mode filters 52b and 53a.

The ground electrodes 58 are connected via connection electrodes 59 to the ground sides of the IDTs of the multi-mode filters 52a, 52b, 53a and 53b.

The present preferred embodiment achieves the same effects as the surface acoustic wave filter apparatus of the first preferred embodiment explained in FIG. 1 to FIG. 5.

Figure 7:
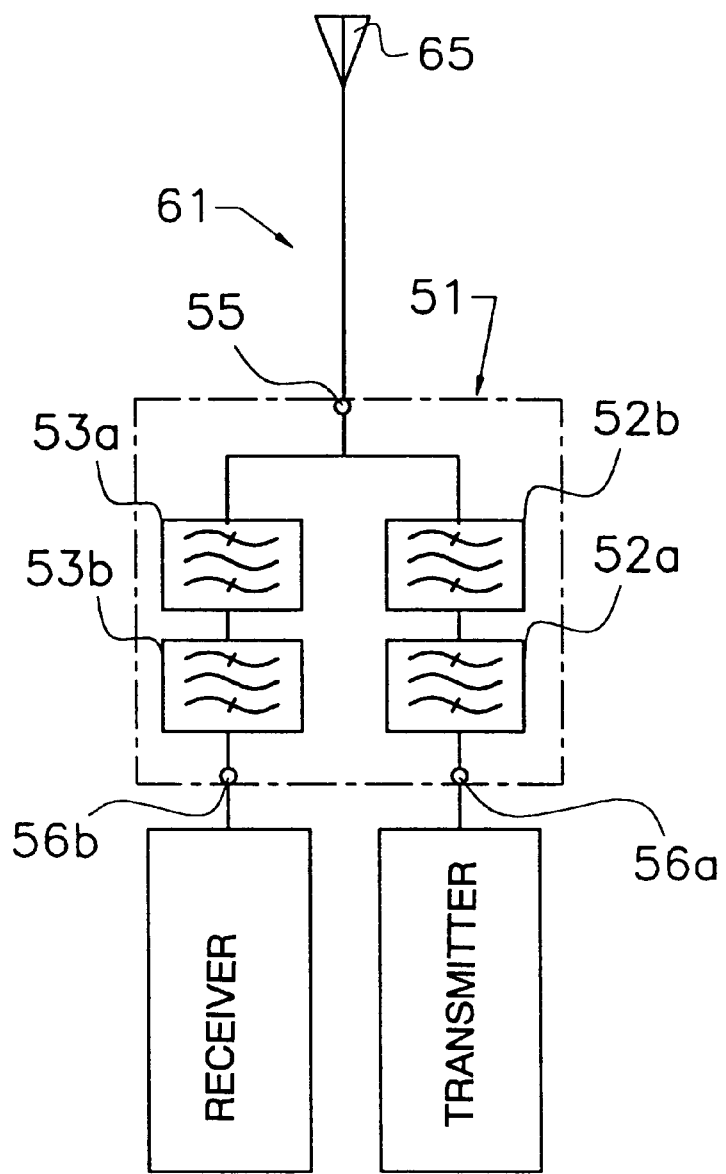
FIG. 7 is a block diagram of a communications apparatus according to a third preferred embodiment of the present invention.
Figure 8:
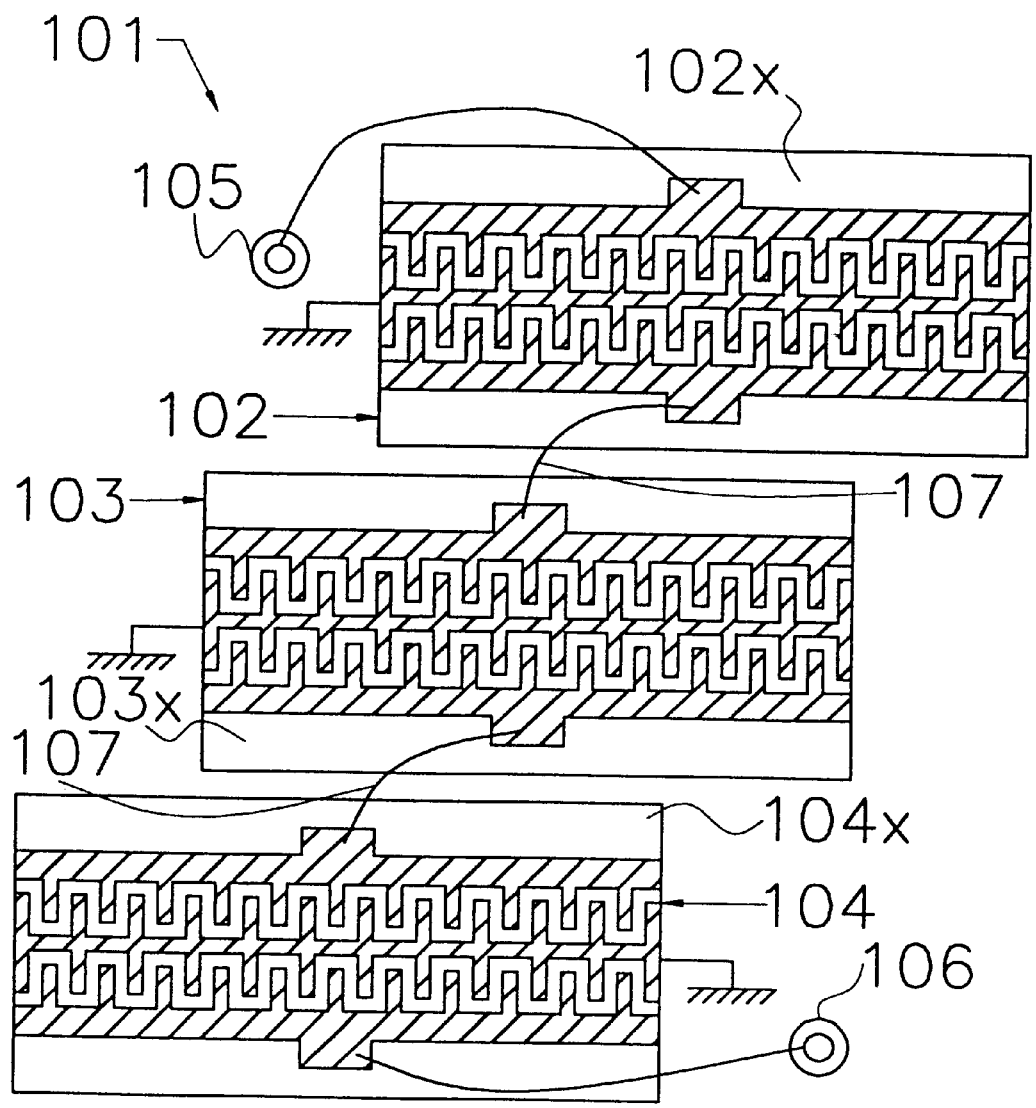
FIG. 8 is a plan view of a conventional surface acoustic wave filter apparatus.
Figure 9:
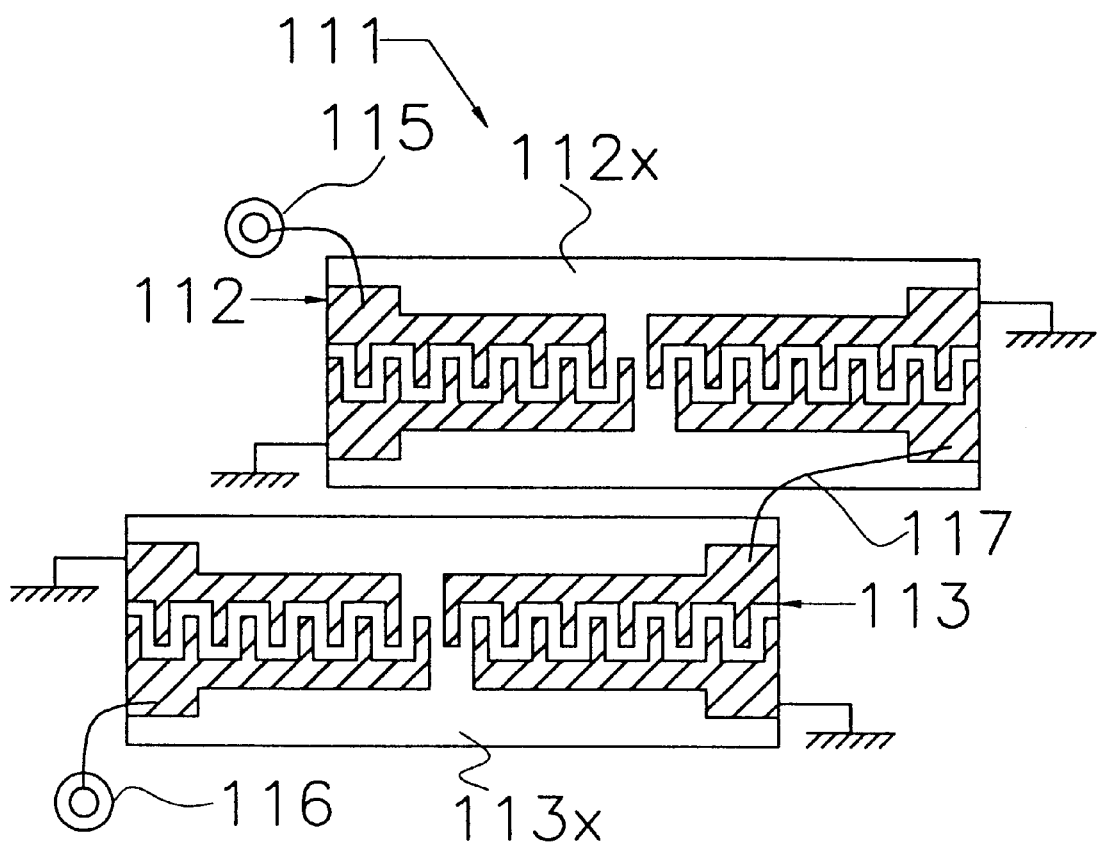
FIG. 9 is a plan view of another conventional surface acoustic wave filter apparatus.

Next, a third preferred embodiment of the present invention will be explained. FIG. 7 is a plan view of a communications apparatus illustrating a third preferred embodiment of the present invention. The same reference characters are used to designate the same members as those in FIG. 6, and detailed explanation of these is omitted.

As shown in FIG. 7, a communications apparatus 61 includes the duplexer 51, which has surface acoustic wave filters 53a and 53b which are used for receiving signals and surface acoustic wave filter apparatuses 52b and 52a which are used for transmitting signals. An input/output port 55 of the duplexer 51 is connected to an antenna 65, the input/output port 56b is connected to a receiver circuit, and the input terminal 56a is connected to a transmitter circuit.

In the first and second preferred embodiments, the end surfaces for reflecting surface acoustic waves of the edge-reflection type surface acoustic wave resonators were formed by dicing and cutting a mother board. However, the present invention is not limited to this, and it is acceptable to provide grooves and holes, using a procedure such as dicing, and thereafter to cut out each piezoelectric substrate using dicing or the like.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter apparatus comprising:
   a piezoelectric substrate;
   a plurality of stages of multi-mode filters which are defined by a plurality of edge-reflection type surface acoustic wave devices and are electrically connected in series with each other, said plurality of stages of multi-mode filters are all located on said piezoelectric substrate and arranged to extend in a direction which is substantially perpendicular to a propagation direction of surface acoustic waves generated therein; and
   a plurality of ground electrodes located between respective stages of said plurality of stages of said multi-mode filters.

2. The surface acoustic wave filter apparatus according to claim 1, wherein at least one of the multi-mode filters of said plurality of stages of multi-mode filters is coupled in a longitudinal mode.

3. The surface acoustic wave filter apparatus according to claim 1, wherein at least one of the multi-mode filters of said plurality of stages of multi-mode filters is coupled in a transversal mode.

4. The surface acoustic wave filter apparatus according to claim 1, wherein said ground electrodes occupy more than about half of the space between stages of said plurality of multi-mode filters.

5. The surface acoustic wave filter apparatus according to claim 1, further comprising connection electrodes, wherein said ground electrodes are connected together by said connection electrodes.

6. The surface acoustic wave filter apparatus according to claim 1, wherein said multi-mode filters include interdigital transducers and a distance between the stages of said plurality of multi-mode filters is greater than an intersection width of said interdigital transducers which define said multi-mode filters.

7. The surface acoustic wave filter apparatus according to claim 1, wherein said multi-mode filters include interdigital transducers, one part of the interdigital transducers of said plurality of multi-mode filters is divided, and, in the divided part, ground sides of the interdigital transducers of said plurality of multi-mode filters are connected at a plurality of portions to said ground electrodes.

8. A duplexer comprising:
   a piezoelectric substrate;
   a plurality of stages of multi-mode filters which are defined by a plurality of edge-reflection type surface acoustic wave devices and are electrically connected in series with each other, said plurality of stages of multi-mode filters are all located on said piezoelectric substrate and arranged to extend in a direction which is substantially perpendicular to a propagation direction of surface acoustic waves generated therein; and
   a plurality of ground electrodes located between respective stages of said plurality of stages of said multi-mode filters.

9. The duplexer according to claim 8, wherein at least one of the multi-mode filters of said plurality of stages of multi-mode filters is coupled in a longitudinal mode.

10. The duplexer according to claim 8, wherein at least one of the multi-mode filters of said plurality of stages of multi-mode filters is coupled in a transversal mode.

11. The duplexer according to claim 8, wherein said ground electrodes occupy more than about half of the space between stages of said plurality of multi-mode filters.

12. The duplexer according to claim 8, further comprising connection electrodes, wherein said ground electrodes are connected together by said connection electrodes.

13. The duplexer according to claim 8, wherein said multi-mode filters include interdigital transducers and a distance between the stages of said plurality of multi-mode filters is greater than an intersection width of said interdigital transducers which define said multi-mode filters.

14. The duplexer according to claim 8, wherein said multi-mode filters include interdigital transducers, one part of the interdigital transducers of said plurality of multi-mode filters is divided, and, in the divided part, ground sides of the interdigital transducers of said plurality of multi-mode filters are connected at a plurality of portions to said ground electrodes.

15. A communications apparatus comprising:
   a piezoelectric substrate;
   a plurality of stages of multi-mode filters which are defined by a plurality of edge-reflection type surface acoustic wave devices and are electrically connected in series with each other, said plurality of stages of multi-mode filters are all located on said piezoelectric substrate and arranged to extend in a direction which is substantially perpendicular to a propagation direction of surface acoustic waves generated therein; and a plurality of ground electrodes located between respective stages of said plurality of stages of said multi-mode filters.

16. The communications apparatus according to claim 15, wherein at least one of the multi-mode filters of said plurality of stages of multi-mode filters is coupled in a longitudinal mode.

17. The communications apparatus according to claim 15, wherein at least one of the multi-mode filters of said plurality of stages of multi-mode filters is coupled in a transversal mode.

18. The communications apparatus according to claim 15, wherein said ground electrodes occupy more than about half of the space between stages of said plurality of multi-mode filters.

19. The communications apparatus according to claim 15, further comprising connection electrodes, wherein said ground electrodes are connected together by said connection electrodes.

20. The communications apparatus according to claim 15, wherein said multi-mode filters include interdigital transducers and a distance between the stages of said plurality of multi-mode filters is greater than an intersection width of said interdigital transducers which define said multi-mode filters.

21. The communications apparatus according to claim 15, wherein said multi-mode filters include interdigital transducers, one part of the interdigital transducers of said plurality of multi-mode filters is divided, and, in the divided part, ground sides of the interdigital transducers of said plurality of multi-mode filters are connected at a plurality of portions to said ground electrodes.

* * * * *